United States Patent
Joshi

(10) Patent No.: US 9,899,325 B2
(45) Date of Patent: Feb. 20, 2018

(54) DEVICE AND METHOD FOR MANUFACTURING A DEVICE WITH A BARRIER LAYER

(71) Applicant: Infineon Technologies AG, Neubiberg (DE)

(72) Inventor: Ravi Joshi, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 224 days.

(21) Appl. No.: 14/453,629

(22) Filed: Aug. 7, 2014

(65) Prior Publication Data

US 2016/0043034 A1  Feb. 11, 2016

(51) Int. Cl.
| | | |
|---|---|---|
| C23C 18/00 | (2006.01) | |
| H01L 23/532 | (2006.01) | |
| H01L 21/768 | (2006.01) | |
| H01L 23/48 | (2006.01) | |

(52) U.S. Cl.
CPC ........ H01L 23/53238 (2013.01); C23C 18/00 (2013.01); H01L 21/7685 (2013.01); H01L 21/76831 (2013.01); H01L 21/76834 (2013.01); H01L 21/76898 (2013.01); H01L 23/481 (2013.01); H01L 23/53223 (2013.01); H01L 23/53252 (2013.01); H01L 2924/0002 (2013.01)

(58) Field of Classification Search
CPC . H01L 2924/00; H01L 51/5253; H01L 51/56; H01L 31/18; H01L 31/022425; H01L 23/53238; C23C 18/00
See application file for complete search history.

(56) References Cited

U.S. PATENT DOCUMENTS

| | | | | |
|---|---|---|---|---|
| 6,207,559 | B1 * | 3/2001 | Jiang | H01L 24/12 257/E21.511 |
| 6,395,053 | B1 * | 5/2002 | Fau | B01J 13/003 427/216 |
| 7,629,661 | B2 * | 12/2009 | Rafferty | H01L 27/14623 257/290 |
| 8,367,461 | B2 * | 2/2013 | Kuegler | C23C 18/1216 257/E21.461 |

(Continued)

FOREIGN PATENT DOCUMENTS

| | | |
|---|---|---|
| CN | 101743340 A | 6/2010 |
| WO | 2009010142 A2 | 1/2009 |

OTHER PUBLICATIONS

Hill et al., Towards new precursors for ZnO thin films by single source CVD: the X-ray structures and precursor properties of zinc ketoacidoximates, 2005, Inorganica Chimica Acta, 358, pp. 201-206.*

(Continued)

*Primary Examiner* — Marcos D Pizarro
*Assistant Examiner* — Shannon Yi
(74) *Attorney, Agent, or Firm* — Viering, Jentschura & Partner mbB

(57) ABSTRACT

In various embodiments a method of forming a device is provided. The method includes forming a metal layer over a substrate and forming at least one barrier layer. The forming of the barrier layer includes depositing a solution comprising a metal complex over the substrate and at least partially decomposing of the ligand of the metal complex.

19 Claims, 8 Drawing Sheets

(56) References Cited

U.S. PATENT DOCUMENTS

| | | | | |
|---|---|---|---|---|
| 2006/0131751 | A1* | 6/2006 | Minamihaba | H01L 21/76823 257/758 |
| 2006/0214305 | A1* | 9/2006 | Sakata | C23C 16/045 257/774 |
| 2013/0102108 | A1* | 4/2013 | Deshmukh | C23C 18/1204 438/95 |
| 2014/0305900 | A1* | 10/2014 | Rogers | H05K 13/0023 216/13 |
| 2014/0332961 | A1* | 11/2014 | Lee | B32B 15/01 257/751 |
| 2015/0069620 | A1* | 3/2015 | Chi | H01L 23/5226 257/774 |
| 2015/0179836 | A1* | 6/2015 | Sewell | H01L 31/022441 136/256 |
| 2015/0221542 | A1* | 8/2015 | Knisley | H01L 21/76883 438/653 |

OTHER PUBLICATIONS

Schneider et al., Zirconia and hafnia films from single source molecular precursor compounds: Synthesis, characterization and insulating properties of potential high k-dielectrics, 2011, Materials Science and Engineering B, 176, pp. 965-971.*

Vogel, Carina Diploma thesis, Schiff-Base-Komplexe der Übergangsmetalle Cr, Mn, De, Co and Ni sowie der Seltenerdmetalle La, Ce, Eu, un Yb als molekulare Vorlaufer for Metalloxide, TU Darmstadt, Fachbereich Chemie (2010), 69 pages.

Joshi, Ravi PhD thesis, Synthesis, alignment, growth mechanism and functional properties of carbon nanotubes and their hybrid materials with inorganic and biomaterials, TU Darmstadt, Fachbereich Chemie (2010), 216 pages.

* cited by examiner

DEVICE AND METHOD FOR MANUFACTURING A DEVICE WITH A BARRIER LAYER

TECHNICAL FIELD

Various embodiments relate generally to devices and a method for manufacturing a device.

BACKGROUND

Following the Moore's law, the semiconductor industry is constantly willing to shrink the chip size in order to increase its performance. In order to do so, the power metal of the semiconductor is required to offer a high electrical and thermal conductivity. Hence, copper is conventionally used as the power metal. However, copper belongs to the category of noble metals and thus lacks a pertinent native oxide layer which obstructs the further diffusion of oxygen into the bulk copper. This leads to several problems such as copper oxidation, delamination, and loss of at least one of a electrical or thermal conductivity. Therefore, an oxide layer which does not allow the diffusion of the oxygen into copper film and thereby oxidizing it is required on the copper film. At present stage, no optimal solution is available to solve those problems. In a conventional method, a thin layer of alumina having a thickness of a few nanometers is deposited on the copper film using an atomic layer deposition (ALD) process. The alumina film formed by ALD is thick enough to insulate the copper against its oxidation and at a same time thin enough for the post bonding processes. A disadvantage of this method is that the ALD process is surface sensitive and also sensitive to the orientation of the copper grains. At the same time, the adhesion of the ALD deposited alumina film is usually not strong enough on the copper film. This leads to the delamination of the alumina film during post processing e.g. in packaging. In addition, ALD needs capital investment. Further, the repetitive pulsed ALD process makes the forming of the alumina layer time ineffective and may lead to high production cost.

Moreover, copper strongly reacts with the semiconductor substrate under the marginal of thermal and electrical budget (thermo/electro-immigration). Therefore, a barrier is required that separates the substrate and copper physically without or minimally influencing the electrical performance of the device. Metal oxides $Al_2O_3$ and $MnO_2$ are known to function as a copper barrier. The alloy of that metal with copper is commonly sputter deposited on the substrate and with thermal budget the alloying metal is diffused out of the alloy to form its oxide at the interface (self forming barrier). However, this technique is not suitable for forming a barrier layer in contact holes of the semiconductor device with relatively high aspect ratios. Further, the required oxygen for the oxide formation of the barrier layer is taken from the $SiO_2$ or from native oxide of the silicon substrate of the semiconductor. Thus, this method is usually not suitable in frequently used devices in which copper alloy is deposited directly on the surface of the silicon substrate without native silicon oxide layer. Further problems of conventional copper barrier materials are the adhesion of copper on the barrier layer, the influence of the barrier on the electrical performance, the cost effectiveness and ease of processing, e.g. the depositing and structuring of the barrier layer.

SUMMARY

In various embodiments a method of forming a device is provided. The method includes forming a metal layer over a substrate and forming at least one barrier layer. The forming of the barrier layer includes depositing a solution comprising a metal complex including a central metal atom or ion and at least one organic ligand over the substrate and at least partially decomposing the at least one organic ligand of the metal complex.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide a device having a hermetically sealed bather layer regarding a diffusion of at least one of a oxygen derivative or material of a metal layer through the barrier layer. The hermetically sealed bather layer may be formed using a cost effect solution approach and moderate temperatures, e.g. a temperature below about 250° C.

In various embodiments, a device 100 includes a substrate 102, at least one bather layer 104, 108 and a metal layer 106 over the substrate 102.

Figure 1:
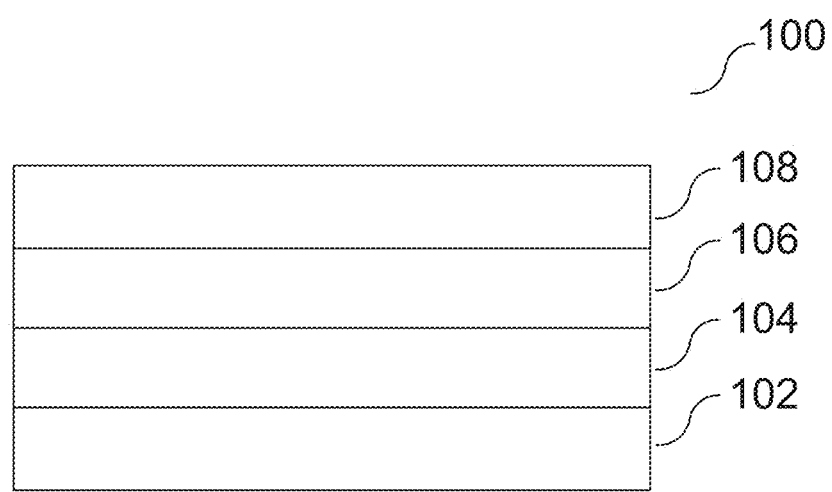
FIG. 1 shows a schematic drawing of a device according to various embodiments.

In various embodiments, e.g. illustrated in FIG. 1 and FIG. 3, the device 100, 300 includes a first bather layer 104 that is formed over, e.g. on, the substrate 102. The metal layer 106 is formed over the first bather layer 104. The first bather layer 104 may be formed as a metal bather such that the first bather layer 104 prevents a diffusion of the material of the metal layer 106 through the first bather layer 104, e.g. from the metal layer 106 into the substrate. Additionally or alternatively, the first bather layer 104 may be formed as an adhesion promoting layer for the metal layer 106. The metal layer 106 may have a higher adhesion on the substrate 102 having the first barrier layer 104 than a device without first bather layer. Hence, the device 100 having the first bather layer 104 between the metal layer 106 and the substrate 102 may have a higher stability than a common device without bather layer 104.

In another embodiment, e.g. illustrated in FIG. 1 and FIG. 2, the device 100, 200 includes a second bather layer 108 that is formed over, e.g. on, the substrate 102 on the metal layer 106. The metal layer 106 is formed over the substrate 102. The second bather layer 108 may be formed as an oxygen barrier. The second bather layer 108 may be formed of a material that is chemically inert regarding chemically active agents of at least one of an acid, base, solvent, oxidizing agents or reducing agents, e.g. of at least one of an oxygen derivative or water vapor, e.g. oxygen, water. The second barrier layer 108 may be formed using a method and having a thickness in a range such that the second barrier layer 108 is hermetically sealing the metal layer 106. Thus, the second barrier layer 108 may prevent a diffusion of at least one oxygen derivative through the barrier layer, e.g. into the metal layer. 106

In yet another embodiment, e.g. illustrated in FIG. 1, the device 100 includes the first barrier layer 104 and the second barrier layer 108 over the substrate 102. The metal layer 106 is formed between the first barrier layer 104 and the second barrier layer 108 over the substrate 102. Hence, the metal layer 106 may be hermetically isolated regarding a device without barrier layers 104, 108; e.g. regarding a device having an exposed surface or interface of a metal layer.

Figure 4A:
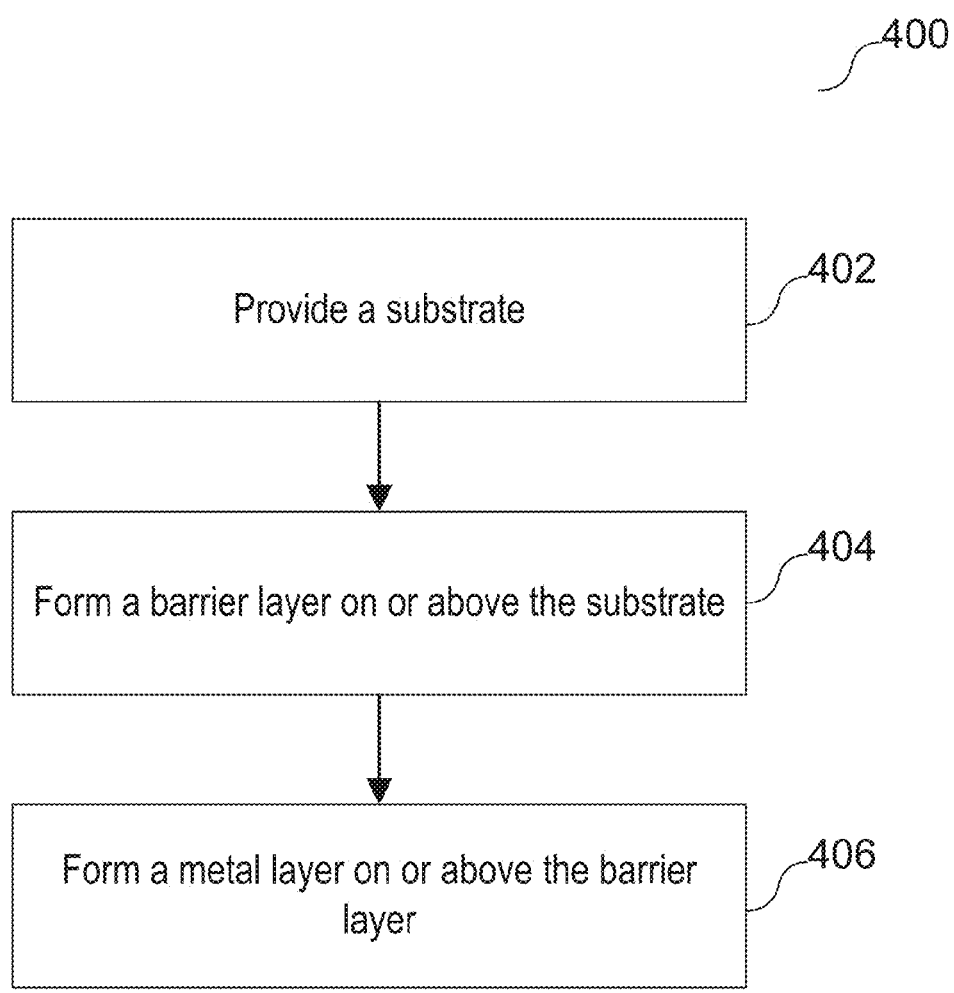
FIG. 4A shows a block diagram of the method to form the device of FIG. 2A and FIG. 2B.
Figure 4B:
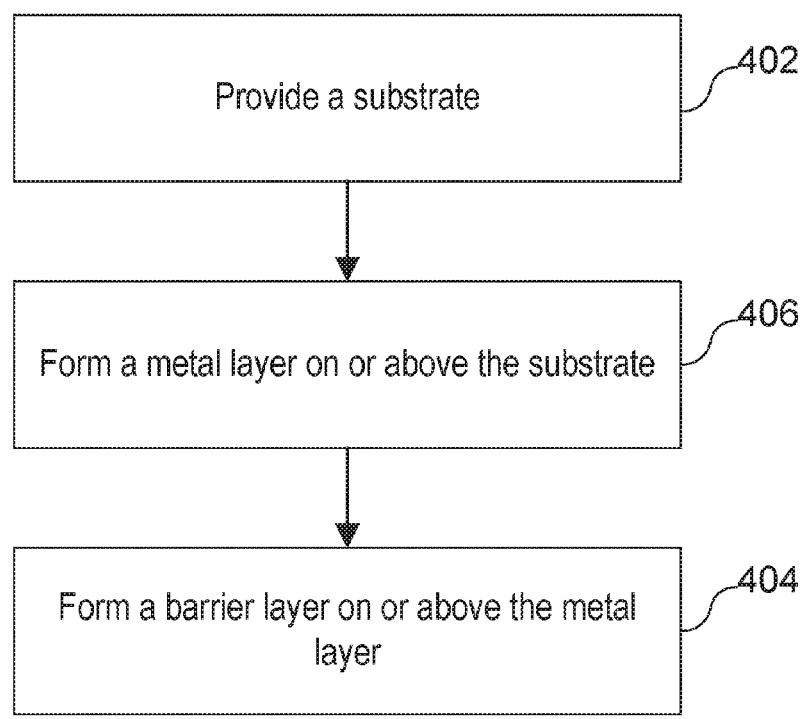
FIG. 4B shows a block diagram of the method to form the device of FIG. 3A and FIG. 3B.
Figure 4C:
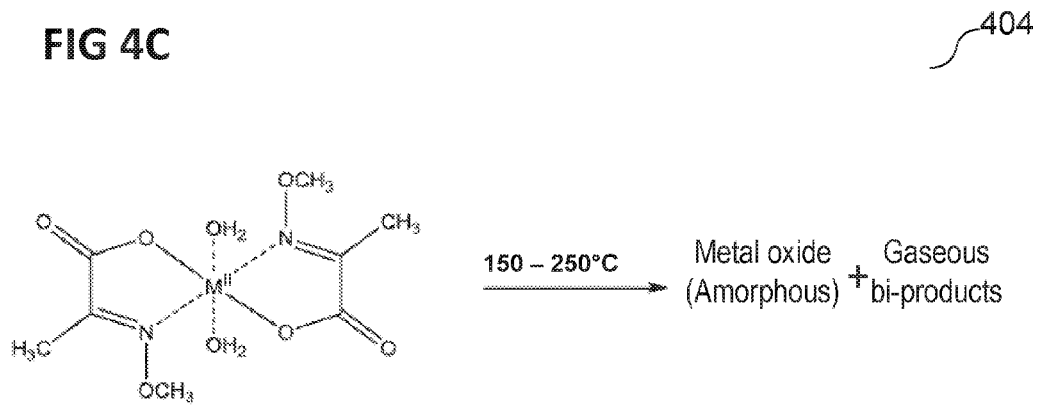
FIG. 4C shows a schematic chemical equation of forming a bather layer of the embodiments of FIG. 4A and FIG. 4B.

In various embodiments a method 400 of forming the device 100 is provided, as illustrated in FIG. 4A to FIG. 4C. The method 400 may include a providing 402 of the substrate 102; a forming 404 of the metal layer 106 over the substrate 102; and a forming 406 of at least one barrier layer 104, 108. The forming 406 of the at least one barrier layer 104, 108 may include a depositing of a solution including a metal complex over the substrate 102. Further, the forming 406 of the at least one barrier layer 104, 108 may include an at least partially decomposing of the metal complex such that the ligand of the metal complex is removed.

Figure 5:
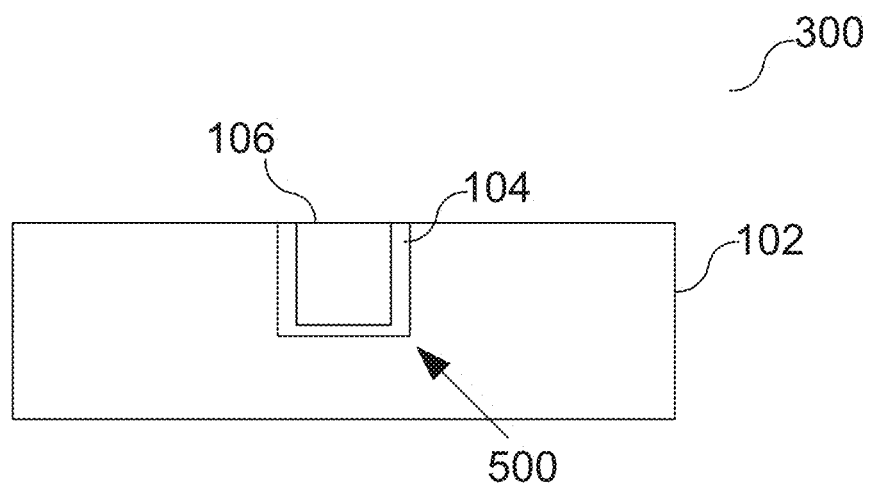
FIG. 5 shows a schematic drawing of various embodiments of the device of FIG. 3.

In various embodiments, the device 100, 200, 300 may be formed as a semiconductor device. The substrate 102 may include or essentially consist of e.g. aluminum nitride, gallium nitride, indium nitride, silicon carbide, zinc sulfide, magnesium selenide, magnesium telluride, zinc selenide, gallium phosphide, aluminium arsenide, cadmium sulfide, zinc telluride, cadmium selenide, aluminium antimonide, cadmium telluride, gallium arsenide, indium phosphide, silicon, germanium, indium arsenide, gallium antimonide, indium antimonide, silicon nitride. The substrate 102 may be a silicon wafer with or without native oxide layer. The substrate 102 may have a surface and a contact hole 500 extending from the surface of the substrate 102 into the body of the substrate 102. The contact hole may have at least one side wall, as illustrated in FIG. 5. The first bather layer 104 may be formed over the surface of the substrate 102. A metal layer 106 may be formed over the first bather layer 104. The first bather layer 104 may be formed over the at least one side wall of the contact hole 500 wherein the contact hole 500 is partially or completely filled with the metal layer 106. The contact hole 500 may have an aspect ratio in a range of about 1 to about 15 (width to depth or height) or more, e.g. in a range of about 1 to about 12, e.g. in a range of about 5 to about 10. A contact hole 500 may be formed as a VIA (vertical interconnect access), e.g. a through silicon VIA (TSV), e.g. with an aspect ratio of about 1 to about 20 or more.

Additionally or alternatively, the device may include a substrate 102 having a surface, wherein the surface is free of oxygen derivatives. The barrier layer 104, 108 may be formed on the surface. The metal layer 104, 108 may be formed on the barrier layer 104, 108. The bather layer 104, 108 may be formed such that the barrier layer 104, 108 prevents a diffusion of the material of the metal layer 106 through the bather layer 104. Additionally or as an alternative, the bather layer 104, 108 may increase the adhesion of the metal layer 104 on the substrate 102 regarding a substrate 102 without bather layer 104.

Figure 6:
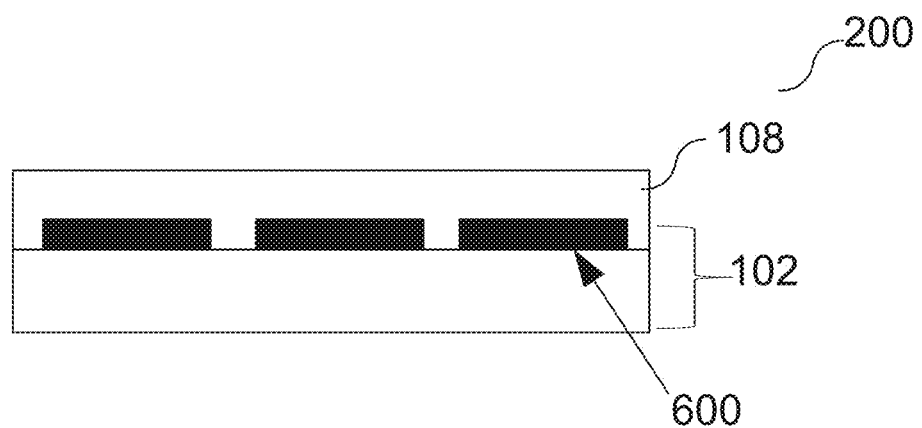
FIG. 6 shows a schematic drawing of various embodiments of the device of FIG. 2.

In various embodiments, the device 200 includes a substrate 102 having a module having at least one semiconductor devices 600, e.g. a plurality or multiplicity of semiconductor devices 600 (three semiconductor devices are illustrated in FIG. 6). A bather layer 108 may be formed over the semiconductor device/s 600 over the substrate 102. The bather layer 108, e.g. a ceramic bather layer 108, may be formed on the semiconductor device/s such that the semiconductor device/s are hermetically sealed regarding a diffusion of oxygen derivatives through the bather layer 108.

The metal layer 106 may include or may be formed of at least one of a noble metal, e.g. Cu, Ag, etc.; a power metal, e.g. Al, Cu, etc.; an oxidable metal, e.g. Cu, Ag, Al, etc., or an alloy thereof. In other words, the metal layer 106 may include or may be formed of at least one of the following elements: Cu, Ni, Pt, Ti, Au, Ag, Al, and/or alloys of them. The metal layer 106 may be formed using a common technique, e.g. a sputter technique. The metal layer 106 may be formed having a thickness in a range of about 1 nm to about 20 μm or even higher, e.g. for TSV. The metal layer 106 may be formed having a thickness in a range of about 10 nm to about 500 nm, in a range of about 25 nm to about 250 nm, e.g. in a range of about 5 μm to about 20 μm.

A bather layer 104, 108 may be formed as a ceramic layer, e.g. a metal oxide layer, a metal nitride layer or a metal oxynitride layer. The bather layer 104, 106 may be formed having a thickness in a range of about a monolayer of material to about 50 μm; in a range of about 25 nm to about 5 μm, in a range of about 50 nm to about 250 nm.

The first bather layer 104 may have a thickness in a range of about 1 nm to 100 nm, e.g. in a range of about 1 to 10 nm, e.g. in a range of about 1 nm to 4 nm. A first bather layer 104 having a thickness below about 5 nm, e.g. 1 nm to 4 nm, may be used if the metal layer 106 is to be contacted electrically through or bypassing the first barrier layer 104. A first barrier layer 104 having a thickness above about 5 nm, e.g. about 20 nm to 300 nm, may be used if the first barrier layer 104 includes a contact VIA such that the metal layer 106 is electrically connected with the substrate 102 by the VIA. A first barrier layer 104 having a thickness of about 300 nm may be formed of TiW.

The second barrier layer 108 may have a thickness in a range of about 1 nm to 100 nm, e.g. in a range of about 2 nm to 20 nm, e.g. in a range of about 2 nm to 3 nm. A second barrier layer 108 having a thickness below about 20 nm, e.g.

2 nm to 3 nm, may be used if the metal layer 106 is to be contacted electrically through or bypassing the second barrier layer 108. A second barrier layer 108 having a thickness above about 20 nm, e.g. about 100 nm, may be used if the second barrier layer 108 is structured such that the metal layer 106 is exposed in at least one area for electrical contacting.

The forming 406 of the barrier layer/s 104, 108 may include the depositing of a solution over the substrate 102, as described above. The solution includes a solvent, e.g. an organic solvent, wherein the metal complex is dissolved (in the solvent). The solvent may be any commercially available solvent. The solvent may be an organic polar aprotic solvent or an organic protic solvent. In various embodiments, it is one of the following solvents: dimethylformamide (DMF), dimethyl sulfoxide (DMSO), methanol, ethanol, 2-methoxyethanol. The solvent may have a boiling point about 100° C. or below, e.g. about 50° C. to about 120° C., e.g. about 50° C. to about 110° C., e.g. about 60° C. to about 80° C. The solvent may have a good wettability on the substrate 102, e.g. a contact angle below about 60°, e.g. below about 40° C., e.g. below about 20° C.

In various embodiments, the solution may contain oxygen. The solution may be free of other chalcogene elements than oxygen. Additionally or as an alternative, the solution may be free of at least one of halogene elements, alkaline metals or alkaline earth metals.

The metal complex includes a central metal atom or ion, and at least one organic ligand. The metal central atom or (cat-)ion is based on an element of one of the following elements: W, V, Ni, Cr, Ti, Zn, Sn, Al, Si, Zr, Hf, Co, Fe, Mn, Cu. In other words: the metal central atom or (cat-)ion may be based on an element such that the barrier layer is formed of a ceramic that may act as a hermetically sealed barrier, e.g. regarding copper.

The organic ligand maybe an oximate ligand, for example a 2-hydroxyiminoalkanoate or 2-alkoxyiminoalkanoate. The alkanoate may be a $C_2$-$C_8$ alkanoate, preferably ethanoate, propanoate, or butanoate, most preferably propanoate. The alkoxy may be $C_1$-$C_4$ alkoxy, preferably methyl or ethyl. In various embodiments, suitable oximate ligands have the structure represented by Formula I

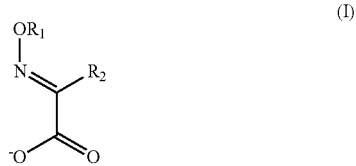

(I)

wherein $R_1$ is selected from the group consisting of hydrogen and $C_1$-$C_4$ alkyl, preferably methyl or ethyl, and $R_2$ is selected from the group consisting of hydrogen, $C_1$-$C_6$ alkyl, $C_6$-$C_{14}$ aryl, and alkylaryl. In the complexes, the central metal atom or ion is bound/coordinated by the nitrogen and the negatively charged oxygen. The number of ligands present in the metal complex depends on the central metal atom or ion, but is typically 2 or 3. In various embodiments, $R_2$ is selected from methyl, ethyl, phenyl and benzyl. In various embodiments, the ligand is a ligand of formula I, wherein $R_1$ and $R_2$ are both methyl, i.e. 2-methoxyiminopropanoate. An exemplary metal complex with 2-methoxyiminopropanaoate as the organic ligand is illustrated in FIG. 4C.

The solution including the metal complex may be deposited over the substrate 102 using at least one of the following methods: spin coating, dip coating, solution coating, spray coating, inkjet printing, screen printing, pad printing. The solution may include a fraction of metal complex in a range of about 0.1 wt % to about 10 wt. % regarding the solution, e.g. in a range of about 0.5 wt % to about 7 wt. %, in a range of about 1 wt % to about 5 wt. %. In other words, additionally or as an alternative, the solution may include a fraction of metal complex in a range of about 0.01 g to about 0.7 g regarding 1 ml of the solution, e.g. in a range of about 0.05 g/ml to about 0.6 g/ml of the solution, in a range of about 0.1 g/ml to about 0.5 g/ml of the solution.

In various embodiments, the solution may include a solvent and the maximum soluble amount of metal complex in the used solvent at the deposition temperature over the substrate 102 or at standard conditions for temperature and pressure (STP). The deposition temperature is the temperature of the solution in the time of the deposition of the solution over the substrate.

In various embodiments, the solution is formed such that a selected metal complex in a selected solvent may have a solubility such that depositing a saturated solution with the selected solvent and the selected metal complex results in a predetermined thickness range of the barrier layer 104, 108.

In various embodiments, the duration of the depositing of the solvent over the substrate 102 is used to adjust of at least one of the thickness, homogeneity or roughness of the bather layer 104, 108.

In various embodiments, the solution may be annealed using at least one of a solvent or thermal anneal after the depositing over the substrate 102 and before the decomposition of the metal complex. Additionally or alternatively, the solution may be dried using a vacuum or solvent containing atmosphere over the substrate 102. Additionally or alternatively, the solution may be dried using a thermal treatment over the substrate.

In various embodiments, the metal complex may be decomposed using a thermal treatment, e.g. in a temperature range of about 150° C. to about 250° C., e.g. depending on the metal and ligand of the metal complex. In other words: the wet chemical approach of forming a bather layer using a solution including a metal complex allows to form an inorganic barrier layer using moderate temperature conditions (up to ~150° C. to 250°). Thus, temperature sensitive substrates, e.g. with a low melting point or including organic layers, may be used as substrates 102. Further, the moderate temperature conditions may form an amorphous or nano-crystalline bather layer having a high degree of purity, e.g. above 90%. Such a bather layer may have a higher hermeticity than a common bather layer that is formed at higher temperature, e.g. above 600° C. In a common high temperature formed bather layer, the bather layer may include larger crystalline area. The grain boundaries of such larger crystalline areas may be more permeable regarding a diffusion of at least one of the material of the metal layer or oxygen derivatives through the barrier layer. Thus, the wet chemical approach of forming a barrier layer using a solution including a metal complex allows to form a barrier layer having a higher hermeticity than a common barrier layer.

Additionally or as an alternative to the temperature based decomposition, the metal complex may be decomposed using of at least one of an UV-irradiation or a plasma treatment. The metal complex may be decomposed such that its organic entities are released in form of a gas. The metal complex may be decomposed such that the barrier layer 104, 108 includes an amorphous structure. An amorphous structure may be formed using a temperature treatment of the solution on the substrate 102 below about 250° C. Alternatively, the metal complex may be decomposed such that the barrier layer 104, 108 includes a nano-crystalline structure. A nano-crystalline structure may be formed using a temperature treatment of the solution on the substrate 102 at a temperature above about 400° C. and below the melting temperature of the metal derivative of the decomposed metal complex.

In one embodiment (not illustrated) a third barrier layer may be formed in contact with the first barrier layer 104 on the first barrier layer 104. This third barrier layer may be more similar to the metal layer than the first barrier layer to the metal layer, e.g. regarding adhesion. By way of example, the substrate 102 may be a silicon wafer. The first barrier layer 104 may be a nickel oxide layer that is formed by a decomposition of a nickel oximate on the substrate 102. The third barrier layer may be a copper oxid layer that is formed by a decomposition of a copper oximate on the nickel oxid layer 104 and heating the copper oximate in air to form copper oxide. The metal layer 106 may be a copper layer that is formed on the copper oxid layer. Alternatively, the copper oxide of the third bather layer may be reduced to copper, e.g. using hydrogen, before the metal (copper) layer 106 is deposited above the substrate 102. Alternatively, the copper of the third bather layer may be formed by heating the copper oximate in an inert atmosphere. An inert atmosphere may be an atmosphere free of oxygen, e.g. an atmosphere of hydrogen, argon, nitrogen. Thus, the third bather layer with or without reduction to copper may increase the adhesion of the copper layer 106 on the substrate 102.

Figure 2A:
FIG. 2A shows a schematic drawing of various embodiments of the device of FIG. 1.
Figure 2B:
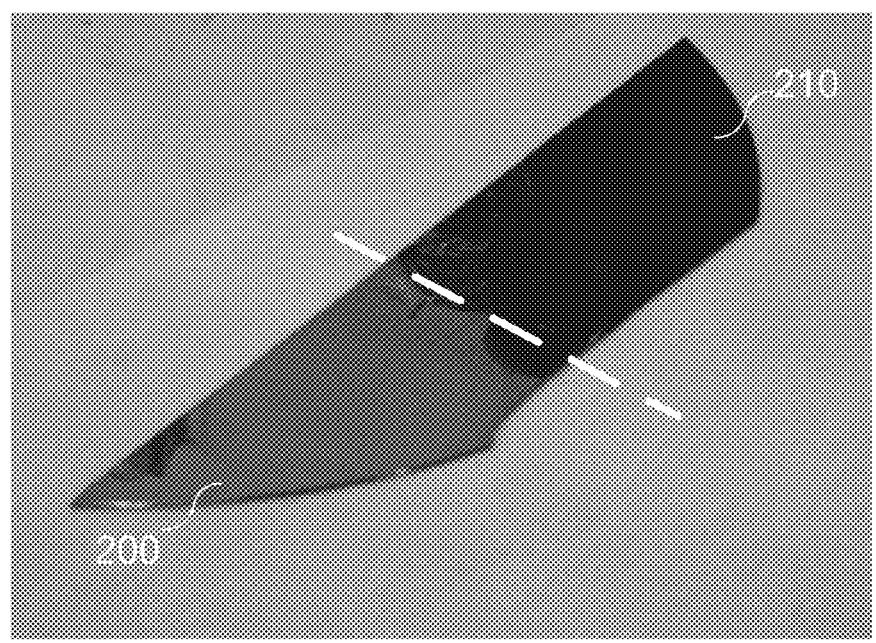
FIG. 2B shows various embodiments of FIG. 2A and a comparative example.

In one embodiment, as illustrated in FIG. 2A and FIG. 4B and as described above, a metal layer 106 may be formed on a substrate 102 and a second barrier layer 108 may be formed on the metal layer 106. The effect of the second bather layer 108 is illustrated in FIG. 2B. The substrate 102 may be a silicon wafer having a layer of TiW having a thickness of about 50 nm. The TiW layer forms a common bather layer for copper. A layer of Cu having a thickness of 50 nm as a metal layer 106 may be formed on this substrate 102. A first area 200 of the Cu-coated substrate is partly coated by a Ni oximate by a Ni oximate solution in DMF using spray coating technique. Subsequently, the wafer piece is heated to about 200° C. to 250° C. and dried for half an hour in air. The optical image in FIG. 2B illustrates that the Cu of the metal layer 106 is not oxidized in the first area 200. The thermal treatment converts Ni oximate to a NiO layer that formed the second bather layer 108 and protected the Cu regarding oxidation. In contrast, the Cu is completely oxidized and blackened in the second area 210 without second bather layer 108. This demonstrates the ability of the NiO, produced from Ni oximate, to protect the Cu from oxidation in air. Hence, a metal layer 106 may be protected from oxidation in a low cost approach by forming a second barrier layer 106 wet chemically on the metal layer 106.

Figure 3A:
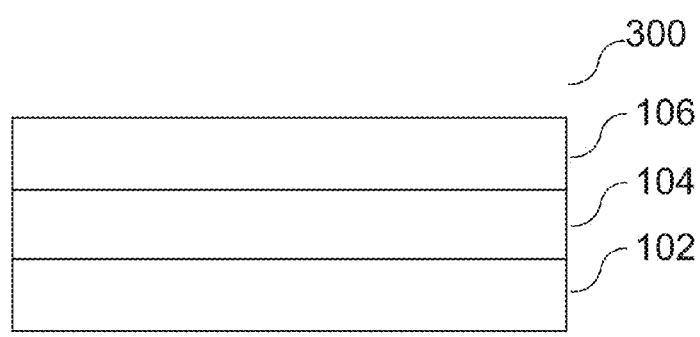
FIG. 3A shows a schematic drawing of various embodiments of the device of FIG. 1.
Figure 3B:
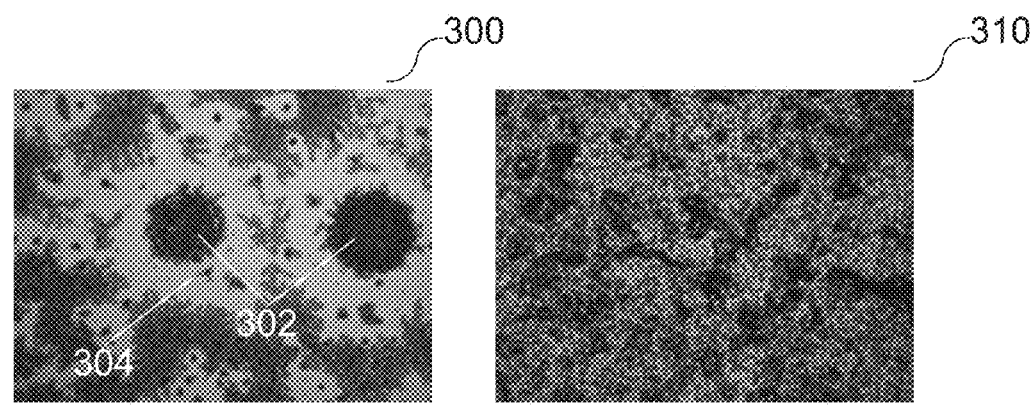
FIG. 3B shows images of various embodiments of FIG. 3A and a comparative example.

In one embodiment, illustrated in FIG. 3A and FIG. 4A and as described above, a first barrier layer 104 may be formed on a substrate 102 and a metal layer 106 on the first barrier layer 104. The effect of the first barrier layer 104 is illustrated in FIG. 3B. The substrate 102 may be a silicon wafer. About 2 ml of Nickel oximate solution in DMF is spin coated on the Si wafer to subsequently form the first barrier layer 104. The silicon wafer with the spin coated nickel oximate film is heated to about 250° C. in air and dried for half an hour. Meanwhile, the nickel oximate decomposed to its respective oxide, as illustrated in FIG. 4C. Thus, the Nickel oximate is converted into NiO. A layer of copper having a thickness of about 50 nm is deposited using a sputtering technique on the nickel oxide surface as metal layer 106 after cooling down the wafer. The silicon wafer with the NiO layer and Cu layer is then heated to about 750° C. under inert atmosphere, e.g. forming gas ($H_2:N_2$), for 10 minutes of soaking time. The wafer is inspected under optical microscope after the thermal annealing, as illustrated in the optical micrographs in FIG. 3B. The nanometer thin copper film is partially agglomerated (reference numeral 302, 310), and partially intact (reference numeral 304) on a wafer after the thermal anneal at 750° C., as illustrated in the optical microscopic image 300. This indicates that the NiO formed from Nickel oximate prevent copper to diffuse into the Si wafer. The partially non-agglomerated copper film indicates that NiO can wet the surface of the wafer and thus offering a better adhesion for copper. Hence, the thickness of the NiO film beneath the Cu can be a deciding factor for its adhesive properties towards the copper. Hence, a NiO layer deposited on the Si wafer using a wet chemical approach acts as a copper diffusion barrier at temperature as high as about 750° C.

In various embodiments, the solution with metal complex used to form the barrier layer 104, 108 may have a solvent and include the maximum soluble amount of metal complex in the used solvent. The thickness of the second barrier layer 108 should not exceed more than a couple of nanometers to avoid a higher electrical resistance or a resistance during chip bonding. The thickness of the barrier layer may be adjusted using the concentration of the metal complex in the solution. Thus, the maximum solubility of the metal complex in a solvent may be used to control or tune the thickness of at least one of the deposited barrier layer on the substrate 102 or on the metal layer 108. In example, the solution having the metal complex, e.g. nickel oximate, may be prepared by solving the metal complex in a solvent, e.g. in DMF. The maximum solubility of the nickel oximate ligand at room temperature in DMF is about 0.7 g/liter. Nickel oximate may not dissolve in most solvents at higher concentration. Additionally or alternatively, the duration of depositing may be used to adjust of at least one of the thickness, homogeneity or roughness of the barrier layer.

The exemplary chemical equation for the decomposing of the metal complex is illustrated in FIG. 4C. The ligand of the metal complex decomposes at around 150° C. to 250° C. such that a metal oxide. The metal complex may be dissolved in various commonly used liquids for the depositing over the substrate. The solution may be deposited on the metal layer using different methodologies as described above, e.g. spray coating, spin coating, dip coating etc. Upon decomposing of the metal complex, the metal oxide/nitride or oxynitride will be formed on the substrate and the organic entities of the metal complex are released in form of gas. Depending on the equivalent weight of the metal in the metal complex, the metal complex loses at about 70 wt. % to 80 wt. % of its weight during the decomposition. The decomposition product may be pure ceramic. The decomposition may be independent of the atmosphere (ambient or inert). The decomposition product of the metal complex may become almost amorphous or very fine nano-crystalline in nature at a decomposition temperature lower than 250° C., as can be seen in XRD (not shown). In contrast, the decomposition product of the metal complex may become nano-crystalline at a decomposition temperature at about 400° C. or higher, depending on which metal oximate is used. A metal oxid containing bather layer may be formed by decomposing the metal complex in an oxygen containing atmosphere.

In various embodiments, a method of forming a device is provided. The method includes forming a metal layer over a substrate; and forming at least one barrier layer. The forming of the at least one bather layer includes a depositing of a solution comprising a metal complex over the substrate; and an at least partially decomposing of the ligand of the metal complex.

In various embodiments, the solution includes a solvent, and about the maximum soluble amount of metal complex in the solvent.

In various embodiments, the metal complex includes a structure as follows:

In various embodiments, the metal complex is decomposed such that its organic entities are released in form of a gas.

In various embodiments, the metal complex is decomposed such that the bather layer includes an amorphous structure.

In various embodiments, the metal complex is decomposed such that the barrier layer includes a nano-crystalline structure.

In various embodiments, the metal complex is decomposed at a temperature below about 250° C.

In various embodiments, the device is a semiconductor device.

In various embodiments, the substrate includes a module having at least one semiconductor device, e.g. semiconductor chips; wherein the barrier layer is formed over the semiconductor device.

In various embodiments, the substrate includes a module having a plurality of semiconductor devices, e.g. semiconductor chips; wherein the barrier layer is formed on the semiconductor devices.

In various embodiments, the substrate having a surface and a contact hole extending from the surface of the substrate into the body of the substrate, the contact hole having at least one side wall; wherein the barrier layer is formed over the at least one side wall of the contact hole; and wherein the contact hole is at least partially filled with the metal layer.

In various embodiments, the metal layer is formed of of least one of a noble metal or an oxidable metal.

In various embodiments, the barrier layer is formed as an adhesion promoting layer for the metal layer, e.g. between the metal layer and the substrate.

In various embodiments, the barrier layer is formed as a ceramic layer.

In various embodiments, the metal layer is formed over the barrier layer.

In various embodiments, the barrier layer is formed over the metal layer.

In various embodiments, a device is provided. The device includes a substrate having a surface, wherein the surface is substantially free of oxygen derivatives; a barrier layer over the surface; and a metal layer over the barrier layer; wherein the barrier layer is formed such that the barrier layer prevents a diffusion of the material of the metal layer through the barrier layer into the substrate.

In various embodiments, a device is provided. The device includes a substrate having a surface and a contact hole extending from the surface of the substrate into the body of the substrate, the contact hole having at least one side wall; a barrier layer disposed over the substrate; and a metal layer disposed over the barrier layer; wherein the barrier layer is formed over the at least one side wall of the contact hole; and wherein the contact hole is at least partially filled with the metal layer.

In various embodiments, a device is provided. The device includes a substrate having a module with two or more semiconductor device/s; a ceramic barrier layer formed in physical contact with the semiconductor devices.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. A method of forming a device, the method comprising:
forming a metal layer over a substrate; and
forming at least one barrier layer, the forming comprising:
depositing a liquid solution comprising a metal complex comprising a central metal atom or ion and at least one organic ligand over the substrate; and
at least partially decomposing the at least one organic ligand of the metal complex,
wherein the organic ligand is an oximate ligand having the structure represented by Formula I

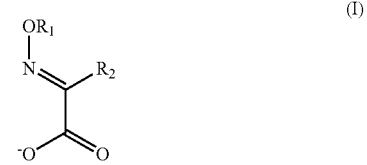

wherein $R_1$ is selected from a group consisting of hydrogen and $C_1$-$C_4$ alkyl and $R_2$ is selected from a group consisting of hydrogen, $C_1$-$C_6$ alkyl, $C_6$-$C_{14}$ aryl, and alkylaryl.

2. The method of claim 1,
wherein the solution comprises
a solvent; and
about a maximum soluble amount of metal complex in the solvent.

3. The method of claim 1,
wherein the metal complex is decomposed at a temperature below about 250° C.

4. The method of claim 1,
wherein the device is a semiconductor device.

5. The method of claim 1,
wherein the substrate comprises a module with at least one semiconductor device;
wherein the barrier layer is formed over the semiconductor device.

6. The method of claim 1,
wherein the substrate comprises a module with a plurality of semiconductor devices;
wherein the barrier layer is formed over the semiconductor devices.

7. The method of claim 1,
wherein the substrate having a surface and a contact hole extending from the surface of the substrate into a body of the substrate, the contact hole having at least one side wall;
wherein the barrier layer is formed over the at least one side wall of the contact hole; and
wherein the contact hole is at least partially filled with the metal layer.

8. The method of claim 1, wherein the metal layer is formed of at least one of a noble metal or an oxidable metal.

9. The method of claim 1, wherein the barrier layer is formed as an adhesion promoting layer for the metal layer between the metal layer and the substrate.

10. The method of claim 1, wherein the barrier layer is formed as a ceramic layer.

11. The method of claim 1, wherein the metal layer is formed over the barrier layer.

12. The method of claim 1, wherein the barrier layer is formed over the metal layer.

13. The method of claim 1, wherein the depositing comprises
depositing the solution over the substrate by at least one of spin coating, dip coating, spray coating, inkjet printing, screen printing, or pad printing.

14. The method of claim 1, further comprising:
annealing the solution using at least one of a solvent or a thermal anneal, after the depositing.

15. A method of forming a device, the method comprising:
forming a first barrier layer over a substrate, the forming of the first barrier layer comprising:
depositing a first liquid solution comprising a metal complex comprising a central metal atom or ion and at least one organic ligand over the substrate;
at least partially decomposing the at least one organic ligand of the metal complex,
forming a metal layer over the first barrier layer; and
forming a second barrier layer over the metal layer, the forming of the second barrier layer comprising:
depositing a second liquid solution comprising a metal complex comprising a central metal atom or ion and at least one organic ligand over the substrate; and
at least partially decomposing the at least one organic ligand of the metal complex.

16. The method of claim 15, wherein the first liquid solution and the second liquid solution are the same.

17. The method of claim 15, wherein the organic ligand is an oximate ligand having the structure represented by Formula I

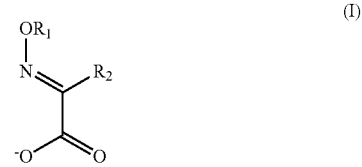

wherein $R_1$ is selected from a group consisting of hydrogen and $C_1$-$C_4$ alkyl and $R_2$ is selected from the group consisting of hydrogen, $C_1$-$C_6$ alkyl, $C_6$-$C_{14}$ aryl, and alkylaryl.

18. The method of claim 15, further comprising forming a third barrier layer between the first barrier layer and the metal layer, the forming of the third barrier layer comprising:
depositing a third liquid solution comprising a metal complex comprising a central metal atom or ion and at least one organic ligand over the substrate, wherein the third liquid solution is different from the first solution; and
at least partially decomposing the at least one organic ligand of the metal complex.

19. The method of claim 18, wherein the metal complex of the third liquid solution comprises a central metal atom or ion similar to a metal in the metal layer.

* * * * *